United States Patent
Chaiken et al.

(10) Patent No.: US 6,510,012 B1
(45) Date of Patent: Jan. 21, 2003

(54) HIGH-SPEED CMOS BUFFER CIRCUIT WITH PROGRAMMABLE QUADRATIC TRANSFER FUNCTION

(75) Inventors: Alan I. Chaiken, Chandler, AZ (US); Mark J. Chambers, Gilbert, AZ (US); Jose O. Perez, Tempe, AZ (US)

(73) Assignee: Texas Instruments Incorporated, Dallas, TX (US)

( * ) Notice: Subject to any disclaimer, the term of this patent is extended or adjusted under 35 U.S.C. 154(b) by 44 days.

(21) Appl. No.: 09/627,960

(22) Filed: Jul. 28, 2000

(51) Int. Cl.$^7$ .............................. G11B 5/02; G11B 5/09
(52) U.S. Cl. ........................................ 360/25; 360/46
(58) Field of Search .................... 360/25, 31, 46

(56) References Cited

U.S. PATENT DOCUMENTS 5,790,335 A * 8/1998 Sugawara et al. ............ 360/68
5,943,177 A * 8/1999 Matthews et al. ............ 360/65

* cited by examiner

Primary Examiner—Regina N. Holder
(74) Attorney, Agent, or Firm—W. Daniel Swayze, Jr.; W. James Brady; Frederick J. Telecky, Jr.

(57) ABSTRACT

An asymmetry correction circuit for correcting an asymmetry signal includes a first transconductance circuit for transforming the asymmetry signal to a bias current in a first current path, a second transconductance circuit to form the bias current in a second current path, and a feed-forward circuit for transforming the asymmetry signal to a positive difference current and a negative difference current.

18 Claims, 2 Drawing Sheets

HIGH-SPEED CMOS BUFFER CIRCUIT WITH PROGRAMMABLE QUADRATIC TRANSFER FUNCTION

FIELD OF THE INVENTION

The present invention is related to circuits and methods for performing nonlinear signal compensation to correct pulse asymmetry.

BACKGROUND OF THE INVENTION

In magnetic disk storage systems for computers, digital data serves to modulate the current in a read/write head coil so that a sequence of corresponding magnetic flux transitions are written onto a magnetic medium in concentric tracks. To read this recorded data, the read/write head passes over the magnetic medium and transduces the magnetic transitions into pulses in an analog signal that alternate in polarity. These pulses are then decoded by read channel circuitry to reproduce the digital data. One type of magnetic transducer which is widely used for reading digital data from a magnetic medium is a magneto-resistive (MR) head.

An MR head is a device whose resistance varies with the applied magnetic field. In this regard, the head is capable of converting magnetic field variations produced by a rotating track into a time varying voltage or current in an electrical circuit. MR heads offer many advantages over other types of magnetic transducers and, consequently, are increasingly being used in magnetic data storage systems. For example, MR heads are more sensitive than other types of read heads, such as thin film heads, and produce a stronger read signal. Also, MR heads have a better frequency response than other types of heads which use inductive coils as a sensing means. In addition, the read signal produced by an MR head is relatively insensitive to the relative velocity between the head and the medium, as is the case with other types of heads, because it is the level of the applied magnetic field which is sensed by an MR head and not the rate of change of magnetic flux lines through a coil. This is an advantage in systems where head/medium velocity may vary over a significant range. Lastly, because MR heads are not capable of writing data on a magnetic medium, magnetic data storage systems which use MR read heads must include a separate head to perform the write function. Using a separate head for reading and writing allows each head to be separately optimized for performing its singular task which can greatly improve the performance of a magnetic data storage system.

An asymmetric characteristic is illustrated in FIG. 1. This asymmetric characteristic can produce problems in the conversion of the magnetic field variations emanating from the medium into the time varying electrical signal. For example, the asymmetric nature of the MR head may cause the time varying electrical signal produced by the head to look nothing like the magnetic signal applied to the head. To overcome this problem, a bias current is generally applied to the head to move the quiescent operating point of the head to be more asymmetric of the resistance characteristic.

Thus, proper biasing of the magneto-resistive element is critical for symmetric performance of the magneto-resistive transducer. Ideally, the magneto-resistive element should be magnetically biased by a soft film such that its voltage outputs, which correspond to the transitions in the magnetic field signal stored in the magnetic storage medium, are symmetrical about a reference voltage. However, various factors result in asymmetry of the outputs. One of the factors is the microstructural and magnetic property variations of the soft film at a microscopic level on the wafer. Moreover, the soft film properties are not uniform across the wafer. The presence of residues and contaminants on the wafer surface before soft film deposition enhances the non-uniformities even further. All of these result in non-systematic variations in the aforementioned voltage output asymmetry between manufactured magneto-resistive read heads.

It has been noted that the degree of asymmetry varies and, correspondingly, there is a need to adjust the asymmetry in accordance with this variance.

SUMMARY OF THE INVENTION

The present invention provides a circuit that performs an inverse nonlinear compensation to remove a portion of the signal distortion and thus diminish the degrading effects on the bit error rate (BER). The present invention employs a feed-forward circuit which compensates the asymmetrical signal. The circuit of the present invention uses a gain transfer function that employs a Taylor series expansion to yield a quadratic equation with a second order coefficient modified by k which is digitally programmable. The second order term is used to produce an inverse distortion to the signal which can approximately eliminate the MR asymmetry distortion.

DETAILED DESCRIPTION OF THE PRESENT INVENTION

Figure 1:
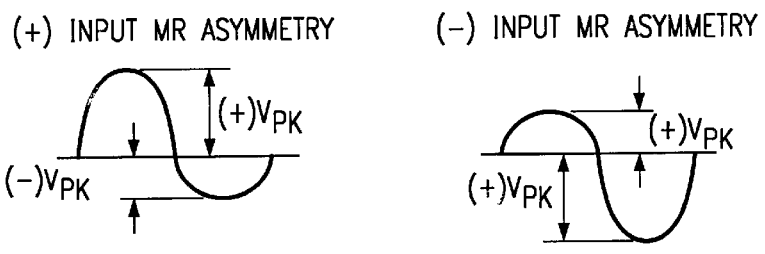
FIG. 1 illustrates asymmetry associated with an MR head.
Figure 2:
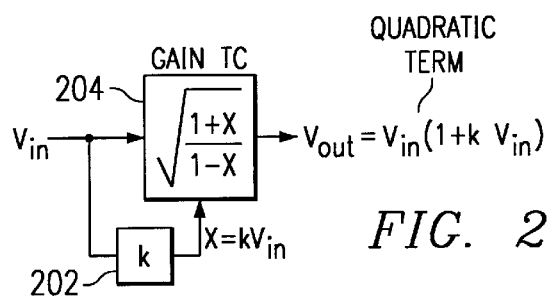
FIG. 2 illustrates a block diagram of the MR asymmetry correction circuitry.

In FIG. 2, the MR asymmetry correction circuit 204 performs an inverse nonlinear compensation to remove a significant amount of signal distortion caused by the asymmetry and significantly diminishes the degrading effects of BER. FIG. 2 illustrates a simplified functional block design. The MRAC circuit 204 employs a CMOS Gm-Gm amplifier topology which as a gain transfer function of sqrt (1+x)/(1−x). Additionally, a feed-forward circuit 202 is used to modulate the X term in the MR asymmetry correction circuit 204. The simplified Taylor series expansion for this equation yields a quadratic equation with a second order coefficient given by the constant which is digitally programmable. The second order term is used to produce an inverse distortion to the signal from the MR head which can approximately eliminate the MR asymmetry distortion.

Figure 3:
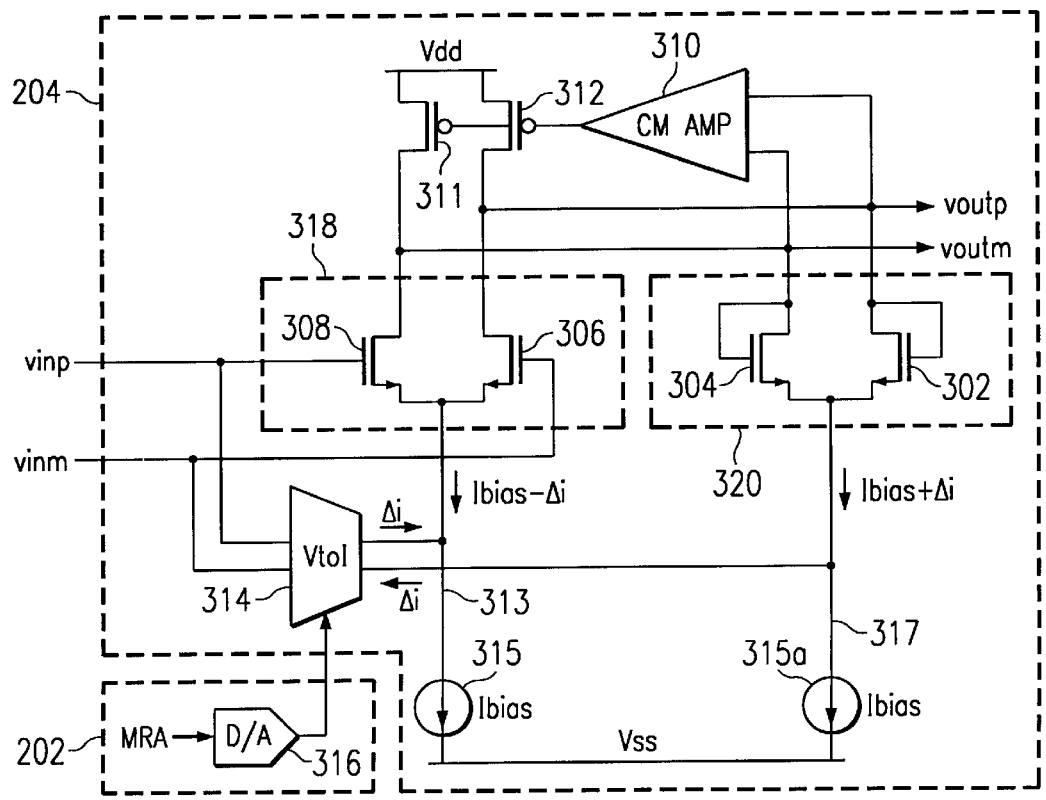
FIG. 3 illustrates a detailed circuit diagram of the present invention.

FIG. 3 illustrates the details of the feed-forward circuit 202 and the MRAC circuit 204.

The MR asymmetry correction circuit includes two transconductance elements 318 and 320. Transconductance element 318 includes two NFETs 306 and 308 having the sources connected together. More particularly, NFET 308 has a source of NFET 308 connected to the source of NFET 306. The gate of NFET 306 receives the input signal $V_{INM}$, and the gate of NFET 308 receives the voltage signal $V_{INP}$. The drain of NFET 308 is connected to the drain of NFET 304, and the drain of NFET 306 is connected to the drain of NFET 302. Additionally, the drain of NFET 302 is connected to the gate of NFET 302, and the drain of NFET 304 is connected to the gate of NFET 304. The source of NFET 304 is connected to the source of NFET 302. The source of NFET 308 and the source of NFET 306 is connected to current source 314 to form a first current path 313, and the source of NFET 304 is connected to the source of NFET 302 which is connected to current generator 316 to form a second current path 317. The drain of NFET 304 is connected to one input of common mode amplifier 310, and the drain of NFET 302 is connected to the other input of common mode amplifier 310. The output of common mode amplifier 310 is connected to the gates of PFET 312 and PFET 311. The source of PFET 312 and the source of PFET 311 are connected to voltage $V_{DD}$. The drain of PFET 312 is connected to the drain of NFET 306 while the drain of PFET 311 is connected to the drain of NFET 308. The source of NFET 308 and the source of NFET 306 are connected to one of the differential outputs of transconductance circuit 314. Additionally, the source of NFET 304 is connected to the source of NFET 302 which is connected to the other differential output of transconductance circuit 314. Additionally, a digital-to-analog converter 316 outputs a signal value k which controls the transconductance of transconductance circuit 314. The differential outputs from the transconductance circuit 314 algebraically combine with the $I_{BIAS}$ current generators 315 and 315a. Thus, the current from the source of NFET 308 and NFET 306 is current $I_{BIAS}-\Delta i$. In a similar fashion, the current from transconductance element 320 is current $I_{BIAS}+\Delta i$. The input to transconductance circuit 314 is the input signal, namely voltage $V_{INP}$. In addition, another input to transconductance circuit 314 is the voltage $V_{INM}$. Thus, the transconductance circuit 314 outputs a current $\Delta i$ based on the difference between the voltage $V_{INP}$ and the voltage $V_{INM}$. The output of transconductance circuit 314 is two currents which are equal in magnitude to $\Delta i$ but flow in opposite directions, namely a positive difference current and a negative difference current. Thus, the transconductance 314 senses a difference in voltage between the voltage $V_{INP}$ and voltage $V_{INM}$ which are the input voltages. The current that is output from transconductance circuit 314 indicates the magnitude of the voltage difference between $V_{INP}$ and the voltage $V_{INM}$. Transconductance circuit 314 is a feed-forward circuit 202. The digital-to-analog converter 316 is programmable, which changes the value of k. The digital-to-analog converter 316 outputs a signal based on the input signal, the MRA signal from the digital MRA correction control block (element 410 in FIG. 4). The signal output from the digital-to-analog converter 316 is k which controls transconductance circuit 314 to multiply the difference between the input signals $V_{INP}$ and $V_{INM}$. Thus, current is added or subtracted from the two current paths of the MR correction circuit 204. The feed-forward circuit 202 includes the transconductance element 314. The common mode amplifier 310 maintains the output or the common mode for both outputs at approximately 1.8 volts or some other functionally equivalent voltage. Typically, the NFETs 302, 304, 306 and 308 have the same width and length and are biased at a current $I_{BIAS}/2$ so the nominal voltage gain (Gm/Gm=1) is unity. The differential input voltage $V_{INP}$ and $V_{INM}$ drives transconductance circuit 314 which differentially feeds current ($\Delta i$) to the input stage of transconductance circuit 318 and the differential load impedance stage of transconductance circuit 320. The transconductance gain of transconductance circuit 314 relating the magnitude of $\Delta i$ to the differential input voltage $V_{INP}$ and $V_{INM}$ is controlled by the output signal k from the digital-to-analog converter 316. The digital-to-analog converting circuit 316 implements the term $X=k*V_{IN}$ where k is the transconductance controlled by the MRA digital-to-analog converting circuit 316. ($\Delta i = Gm \Delta V_{IN}$) (where Gm is set by k) The resulting transfer function is the quadratic function described hereinabove.

Figure 4:
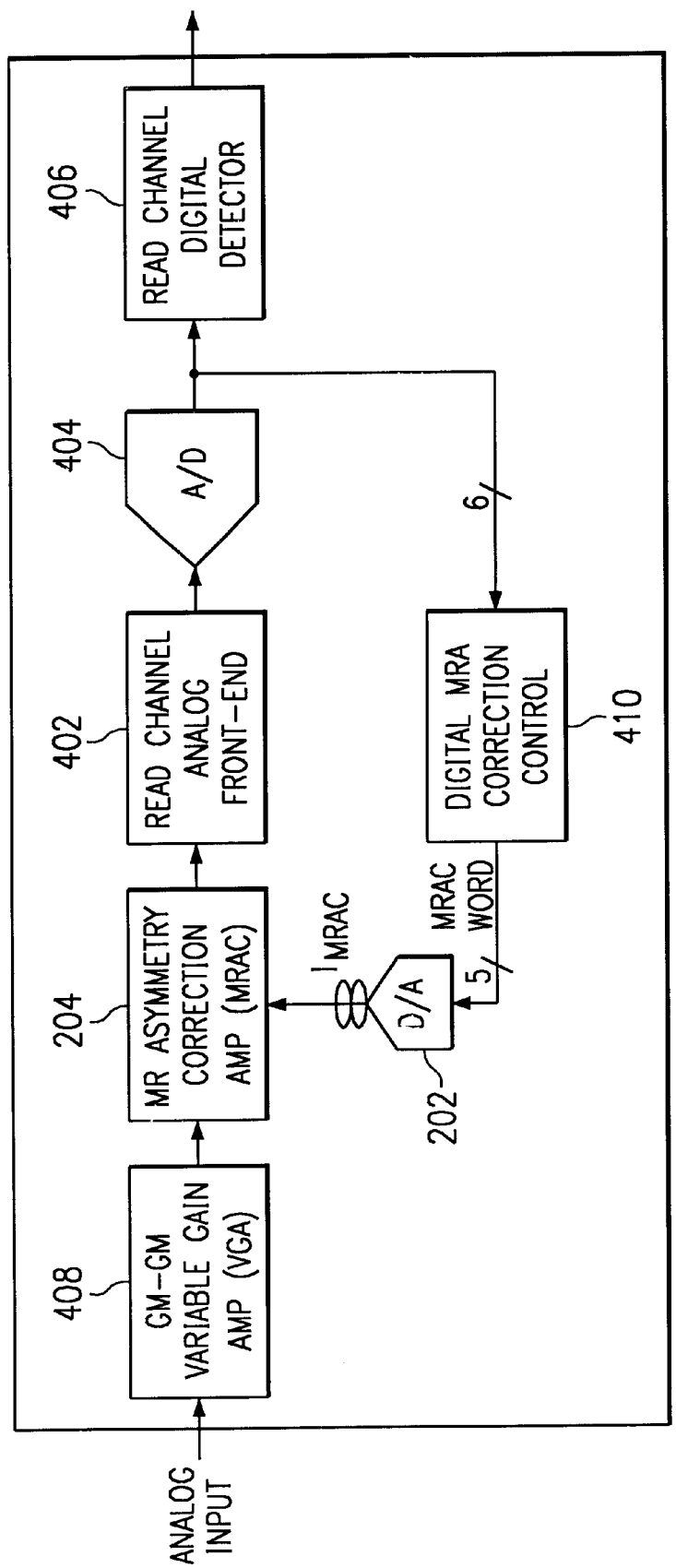
FIG. 4 illustrates a portion of a read channel in block diagram form.

FIG. 4 illustrates a portion of the digital channel. The Gm-Gm variable gain amplifier 408 is connected to the MR asymmetry correction amplifier 204 which is in turn connected to the read channel analog front-end 402 and connected to the analog-to-digital converter 404. The analog-to-digital converter 404 is additionally connected to the digital MRA correction control circuit 410 as well as the read channel digital detector 406. The digital MRA correction control circuit 410 is connected to the digital-to-analog (D/A) converter circuit 202. The output from the analog-to-digital converter 404 is used to determine the necessary correction to the MRAC circuit 204 by the k signal that controls the transconductance circuit 314. The digital MRA correction control circuit 410 generates an MRAC word, which is input to the D/A converter 202 which outputs a signal to the MR asymmetry correction circuit 204.

What is claimed is:

1. An asymmetry correction circuit for correcting an asymmetry signal, comprising:
   a first transconductance circuit for transforming said asymmetry signal to a bias current in a first current path;
   a second transconductance circuit to form said bias current in a second current path; and
   a feed-forward circuit for transforming said asymmetry signal to a positive difference current and a negative difference current;
   wherein said feed-forward circuit adds said positive difference current to said first current path and adds said negative difference current to said second current path.

2. An asymmetry correction circuit, as in claim 1, wherein said feed-forward circuit includes a transconductance circuit.

3. An asymmetry correction circuit, as in claim 2, wherein said bias current is generated by a current generator.

4. An asymmetry correction circuit, as in claim 1, wherein said feed-forward circuit is coupled to a digital-to-analog converter.

5. An asymmetry correction circuit, as in claim 1, wherein said positive difference current corresponds to said asymmetry signal.

6. An asymmetry correction circuit, as in claim 1, wherein said negative difference current corresponds to said asymmetry signal.

7. An asymmetry correction circuit, as in claim 1, wherein a first bias current is in said first current path and a second bias current is in said second current path.

8. An asymmetry correction circuit, as in claim 7, wherein said positive difference current is added to said first bias current.

9. An asymmetry correction circuit, as in claim 7, wherein said negative difference current is added to said second bias current.

10. A disk drive for storing information on a disk, comprising:
   a head to read/write said information on said disk;
   a preamplifier to amplify said information;
   an asymmetry correction circuit for correcting an asymmetry signal from said information;
   a first transconductance circuit for transforming said asymmetry signal to a bias current in a first current path;

a second transconductance circuit to form said bias current in a second current path; and a feed-forward circuit for transforming said asymmetry signal to a positive difference current and a negative difference current;

wherein said feed-forward circuit adds said positive difference current to said first current path and adds said negative difference current to said second current path.

11. A disk drive system, as in claim 10, wherein said feed-forward circuit includes a transconductance circuit.

12. A disk drive system, as in claim 11, wherein said bias current is generated by a current generator.

13. A disk drive system, as in claim 10, wherein said feed-forward circuit is coupled to a digital-to-analog converter.

14. A disk drive system, as in claim 10, wherein said positive difference current corresponds to said asymmetry signal.

15. A disk drive system, as in claim 10, wherein said negative difference current corresponds to said asymmetry signal.

16. A disk drive system, as in claim 10, wherein a first bias current is in said first current path and a second bias current is in said second current path.

17. A disk drive system, as in claim 16, wherein said positive difference current is added to said first bias current.

18. A disk drive system, as in claim 16, wherein said negative difference current is added to said second bias current.

* * * * *